US011740651B2

(12) United States Patent
Chang (10) Patent No.: US 11,740,651 B2
(45) Date of Patent: Aug. 29, 2023

(54) CLOCK MULTIPLEXER DEVICE AND CLOCK SWITCHING METHOD

(71) Applicant: REALTEK SEMICONDUCTOR CORPORATION, Hsinchu (TW)

(72) Inventor: Chi-Fu Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/242,338

(22) Filed: Apr. 28, 2021

(65) Prior Publication Data
US 2021/0382519 A1    Dec. 9, 2021

(30) Foreign Application Priority Data

Jun. 4, 2020 (TW) .................................. 109118839

(51) Int. Cl.
  *G06F 1/10* (2006.01)
  *H03K 17/51* (2006.01)
  *G06F 1/12* (2006.01)
  *G06F 1/06* (2006.01)
  *H03K 19/20* (2006.01)

(52) U.S. Cl.
  CPC .................. *G06F 1/10* (2013.01); *G06F 1/06* (2013.01); *G06F 1/12* (2013.01); *H03K 17/51* (2013.01); *H03K 19/20* (2013.01)

(58) Field of Classification Search
  None
  See application file for complete search history.

(56) References Cited

U.S. PATENT DOCUMENTS

| 5,315,181 A * | 5/1994 | Schowe | .................... H03L 7/00 327/292 |
| 6,535,048 B1 * | 3/2003 | Klindworth | ............... G06F 1/08 327/407 |
| 6,600,345 B1 * | 7/2003 | Boutaud | .................... G06F 1/08 327/99 |

(Continued)

OTHER PUBLICATIONS

OA letter of the counterpart TW application (appl. No. 109118839) dated May 21, 2021. Summary of the OA letter: 1. Claims 1 and 10 are rejected as allegedly being unpatentable over the cited reference 1 (U.S. Pat. No. 10/198,026 B1) in view of the cited reference 2 (U.S. Pat. No. 8,860,468 B1). 2. Claims 2-9 are allowable.

*Primary Examiner* — Thomas J. Hiltunen
*Assistant Examiner* — Khareem E Almo
(74) *Attorney, Agent, or Firm* — WPAT, P.C.

(57) ABSTRACT

A clock multiplexer device includes first and second control circuitries and an output circuitry. The first control circuitry generates a first enable signal and a first signal according to a first clock signal and a first selection signal, and determines whether to output the first signal to be a first output clock signal according to a second selection signal and a second enable signal. The first and the second selection signals have opposite logic values. The second control circuitry generates the second enable signal and a second signal according to a second clock signal and the second selection signal, and determines whether to output the second signal to be a second output clock signal according to the first selection signal and the first enable signal. The output circuitry outputs one of the first output clock signal and the second output clock signal to be a final clock signal.

16 Claims, 5 Drawing Sheets

(56) References Cited

U.S. PATENT DOCUMENTS

| | | | |
|---|---|---|---|
| 6,784,699 B2* | 8/2004 | Haroun | H03L 7/093 |
| | | | 327/407 |
| 6,859,454 B1* | 2/2005 | Bowes | H04L 69/16 |
| | | | 370/537 |
| 8,054,103 B1* | 11/2011 | Janardhanan | G06F 1/12 |
| | | | 326/93 |
| 8,860,468 B1* | 10/2014 | Khandelwal | G06F 1/08 |
| | | | 327/99 |
| 9,360,883 B1* | 6/2016 | Barman | G06F 1/08 |
| 9,612,611 B1* | 4/2017 | Nakibly | G06F 1/04 |
| 10,198,026 B1* | 2/2019 | Nakibly | G06F 1/12 |
| 10,530,370 B1* | 1/2020 | Mohan | H03K 19/20 |
| 2003/0001612 A1* | 1/2003 | Menezes | G06F 1/08 |
| | | | 326/37 |
| 2003/0184347 A1* | 10/2003 | Haroun | G06F 1/08 |
| | | | 327/99 |
| 2014/0223220 A1* | 8/2014 | Guntur | G06F 1/08 |
| | | | 713/501 |

\* cited by examiner

CLOCK MULTIPLEXER DEVICE AND CLOCK SWITCHING METHOD

BACKGROUND

1. Technical Field

The present disclosure relates to a clock multiplexer device, especially to a glitch-free clock multiplexer device and a clock switching method able to avoid a deadlock.

2. Description of Related Art

In some related approaches, a glitch free clock multiplexer employs synchronizer circuits that are coupled in series to sequentially process multiple clock signals, in order to output one of the clock signals. These clock signals are considered to be selectable clock signals to be outputted by this clock multiplexer. In these approaches, in order to achieve glitch free, when the clock multiplexer is switched from outputting a first clock signal having a slower rate to outputting a second clock signal having a faster rate, the clock multiplexer is limited by the first clock signal having the slower rate, or by another independent clock signal due to its serial circuit architecture. Moreover, in these approaches, in the course of switching signals, if a signal source that generates the first clock signal stops outputting the first clock signals suddenly or the other independent clock signal stops, operations of the clock multiplexer may be in a deadlock and the clock multiplexer is thus unable to output the second clock signal properly.

SUMMARY

In some embodiments, a clock multiplexer device includes a first control circuitry, a second control circuitry, and an output circuitry. The first control circuitry is configured to generate a first enable signal and a first signal according to a first clock signal and a first selection signal, and to determine whether to output the first signal to be a first output clock signal according to a second selection signal and a second enable signal, in which the first selection signal and the second selection signal have opposite logic values. The second control circuitry is configured to generate the second enable signal and a second signal according to a second clock signal and the second selection signal, and to determine whether to output the second signal to be a second output clock signal according to the first selection signal and the first enable signal. The output circuitry is configured to output one of the first output clock signal and the second output clock signal to be a final clock signal.

In some embodiments, a clock switching method includes following operations: generating a first enable signal and a first signal according to a first clock signal and a first selection signal, and determining whether to output the first signal to be a first output clock signal according to a second selection signal and a second enable signal, wherein the first selection signal and the second selection signal have opposite logic values; generating the second enable signal and a second signal according to a second clock signal and the second selection signal, and determining whether to output the second signal to be a second output clock signal according to the first selection signal and the first enable signal; and outputting one of the first output clock signal and the second output clock signal to be a final clock signal.

In some embodiments of the present disclosure, the clock multiplexer device and the clock switching method are able to achieve glitch free, and do not require independent additional clock(s), and are not limited by a slower clock signal, and can avoid a deadlock. These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals. The term "gating circuit" may indicate a device formed with one or more logic gates that are connected in a specific arrangement for processing signals.

As used herein, the term "and/or" includes any and all combinations of one or more of the associated listed items. As used herein, the term "at least one of A and B" includes any and all combinations of one or more of the associated listed items (i.e., A and B). Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference numbers.

Figure 1:
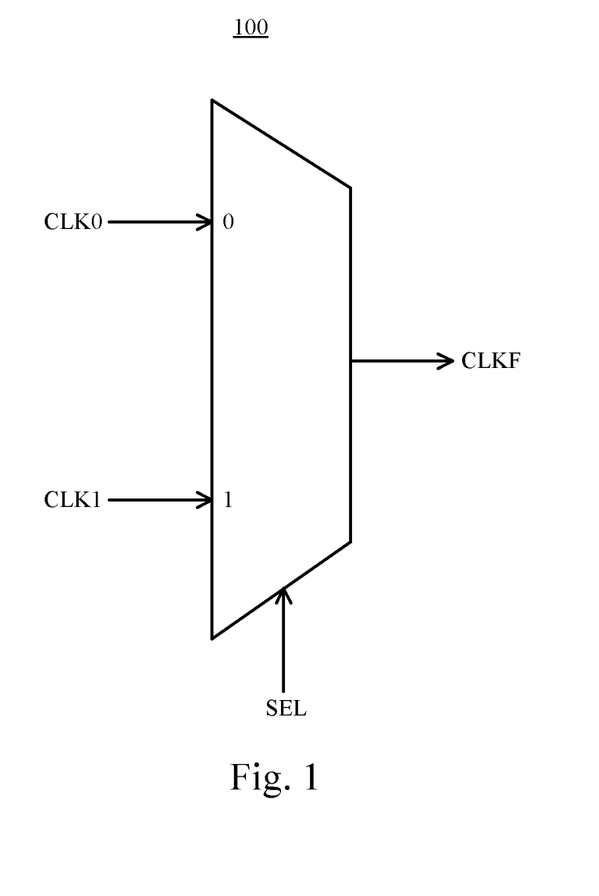
FIG. 1 is a schematic diagram of a clock multiplexer device according to some embodiments of the present disclosure.

FIG. 1 is a schematic diagram of a clock multiplexer device 100 according to some embodiments of the present disclosure. The clock multiplexer device 100 may output one of a clock signal CLK0 and a clock signal CLK1 to be a final clock signal CLKF according to a selection signal SEL. For example, if the selection signal SEL has a logic value of 0, the clock multiplexer device 100 outputs the clock signal CLK0 to be the final clock signal CLKF. If the selection signal SEL has a logic value of 1, the clock multiplexer device 100 outputs the clock signal CLK1 to be the final clock signal CLKF. In some embodiments, a frequency of the clock signal CLK0 is lower than a frequency of the clock signal CLK1.

Figure 2:
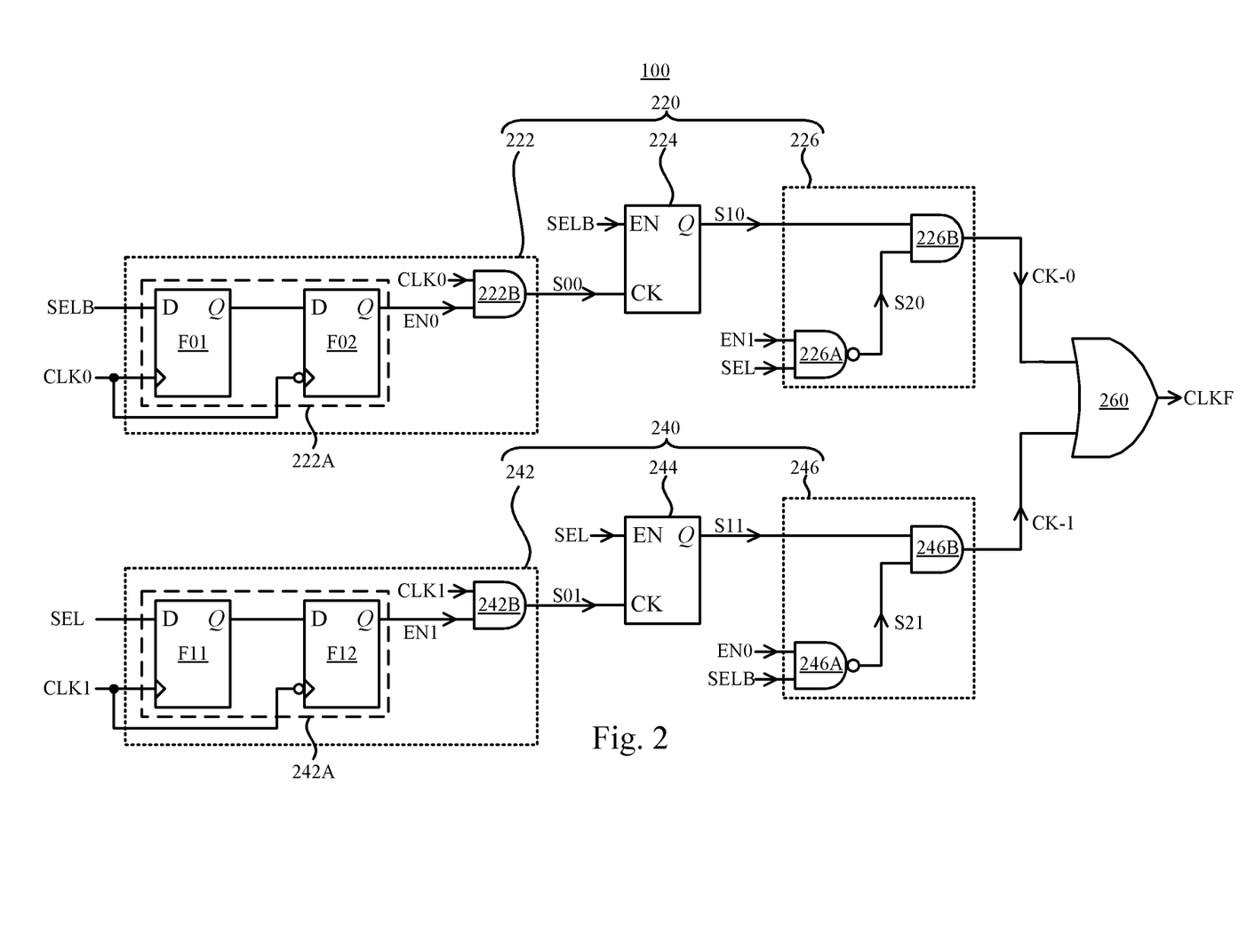
FIG. 2 is a circuit diagram of the clock multiplexer device in FIG. 1 according to some embodiments of the present disclosure.

FIG. 2 is a circuit diagram of the clock multiplexer device 100 in FIG. 1 according to some embodiments of the present disclosure. The clock multiplexer device 100 includes a control circuitry 220, a control circuitry 240, and an output circuitry 260. The control circuitry 220 generates an enable signal EN0 and a signal S10 according to the clock signal CLK0 and a selection signal SELB, and determines whether to output the signal S10 to be an output clock signal CK-0 according to the selection signal SEL and the enable signal EN1. The control circuitry 240 generates an enable signal EN1 and a signal S11 according to the clock signal CLK1 and the selection signal SEL, and determines whether to output the signal S11 to be the output clock signal CK-1 according to the selection signal SELB and the enable signal EN0. The output circuitry 260 outputs one of the output clock signal CK-0 and the output clock signal CK-1 to be the final clock signal CLKF. In some embodiments, the output circuitry 260 may be implemented with an OR gate circuit.

In some embodiments, the selection signal SEL and the selection signal SELB have opposite logic values. In other words, if the selection signal SEL has the logic value of 1 (or the logic value of 0), the selection signal SELB has the logic value of 0 (or the logic value of 1). In some embodiments, the clock multiplexer device 100 may include an inverter circuit (not shown), which is configured to generate the selection signal SELB according to the selection signal SEL.

The control circuitry 220 includes a gating circuit 222, a gating circuit 224, and a gating circuit 226. The gating circuit 222 generates the enable signal EN0 according to the clock signal CLK0 and the selection signal SELB, and outputs the clock signal CLK0 to be the signal S00 according to the enable signal EN0. The gating circuit 222 is able to eliminate a glitch of the clock signal CLK0. For example, the gating circuit 222 includes a synchronizer circuit 222A and an AND gate circuit 222B. The synchronizer circuit 222A receives the selection signal SELB according to the clock signal CLK0 and generates the enable signal EN0. In some embodiments, the synchronizer circuit 222A includes a flip flop circuit F01 and a flip flop circuit F02 that are coupled in series. The flip flop circuit F01 is triggered according to a positive edge of the clock signal CLK0, in order to receive the selection signal SEL. An input terminal of the flip flop circuit F02 is coupled to an output terminal of the flip flop circuit F01, and the flip flop circuit F02 is triggered according to a negative edge of the clock signal CLK0, in order to generate the enable signal EN0. The AND gate circuit 222B generates the signal S00 according to the enable signal EN0 and the clock signal CLK0. In other words, when the enable signal EN0 has the logic value of 1, the AND gate circuit 222B outputs the clock signal CLK0 to be the signal S00. When the enable signal EN0 has the logic value of 0, the AND gate circuit 222B does not output the clock signal CLK0 to be the signal S00, and generates the signal S00 having the logic value of 0.

The gating circuit 224 determines whether to mask the signal S00 according to the selection signal SELB, in order to generate the signal S10. The gating circuit 224 may be implemented with one or more logic circuits. For example, the gating circuit 224 may be an integrated clock gating (ICG) circuit. When the selection signal SELB has the logic value of 1, the gating circuit 224 outputs the signal S00 to be the signal S10. When the selection signal SELB has the logic value of 0, the gating circuit 224 is triggered by a positive edge of the signal S00 to output the selection signal SELB having the logic value of 0 to be the signal S10. That is, the gating circuit 224 masks the positive edge of the signal S00 to generate the signal S10. With such configurations, it assures that the signal S10 is asserted at its positive edge(s) when the clock signal CLK0 is selected, and that the signal S10 is de-asserted at its negative edge(s) when the clock signal CLK0 is not selected. As a result, it is able to avoid generating glitches in the course of switching clock signals.

The gating circuit 226 determines whether to output the signal S10 to be the output clock signal CK-0 according to the selection signal SEL and the enable signal EN1. In some embodiments, the gating circuit 226 includes a NAND gate circuit 226A and an AND gate circuit 226B. The NAND gate circuit 226A generates the signal S20 according to the selection signal SEL and the enable signal EN1. The AND gate circuit 226B generates the output clock signal CK-0 according to the signal S20 and the signal S10. When the signal S20 has the logic value of 1, the AND gate circuit 226B outputs the signal S10 to be the output clock signal CK-0. When the signal S20 has the logic value of 0, the AND gate circuit 226B does not output the signal S10 to be the output clock signal CK-0, and outputs the output clock signal CK-0 having the logic value of 0.

In some embodiments, the control circuitry 240 and the control circuitry 220 have the same circuit architectures. In other words, the control circuitry 240 includes a gating circuit 242, a gating circuit 244, and a gating circuit 246, which respectively correspond to the gating circuit 222, the gating circuit 224, and the gating circuit 226. The gating circuit 242 generates the enable signal EN1 according to the clock signal CLK1 and the selection signal SEL, then outputs the clock signal CLK1 to be the signal S01 according to the enable signal EN1. The gating circuit 242 is configured to eliminate the glitch of the clock signal CLK1. For example, the gating circuit 242 includes a synchronizer circuit 242A and an AND gate circuit 242B. The synchronizer circuit 242A receives the selection signal SEL according to the clock signal CLK1 and generates the enable signal EN1. In some embodiments, the synchronizer circuit 242A includes a flip flop circuit F11 and a flip flop circuit F12 that are coupled in series. The flip flop circuit F11 is triggered according to a positive edge of the clock signal CLK1, in order to receive the selection signal SEL. An input terminal of the flip flop circuit F12 is coupled to an output terminal of the flip flop circuit F11, and the flip flop circuit F12 is triggered according to a negative edge of the clock signal CLK1 to generate the enable signal EN1. The AND gate circuit 242B generates the signal S01 according to the enable signal EN1 and the clock signal CLK1. In other words, when the enable signal EN1 has the logic value of 1, the AND gate circuit 242B outputs the clock signal CLK1 to be the signal S01. When the enable signal EN1 has the logic value of 0, the AND gate circuit 242B does not output the clock signal CLK1 to be the signal S01, and generates the signal S01 having the logic value of 0.

The gating circuit 244 determines whether to mask the signal S01 according to the selection signal SEL to generate the signal S11. The gating circuit 244 may be an integrated clock gating cell circuit. When the selection signal SEL has the logic value of 1, the gating circuit 244 outputs the signal S01 to be the signal S11. When the selection signal SEL has the logic value of 0, the gating circuit 244 is triggered by the positive edge of the signal S01 to output the selection signal SEL having the logic value of 0 to be the signal S11. In other words, the gating circuit 244 masks the positive edge of the signal S01 to generate the signal S11. With the above configuration, it assures that the signal S11 is asserted at its positive edge(s) when the clock signal CLK1 is selected, and that the signal S11 is de-asserted at its negative edge(s) when the clock signal CLK1 is not selected. As a result, it is able to avoid generating glitches in the course of switching clock signals.

The gating circuit 246 determines whether to output the output the signal S11 to be the clock signal CK-1 according to the selection signal SELB and the enable signal EN0. In some embodiments, the gating circuit 246 includes a NAND gate circuit 246A and an AND gate circuit 246B. The NAND gate circuit 246A generates the signal S21 according to the selection signal SELB and the enable signal EN0. The AND gate circuit 246B generates the output clock signal CK-1 according to the signal S21 and the signal S11. When the signal S21 has the logic value of 1, the AND gate circuit 246B outputs the signal S11 to be the output clock signal CK-1. When the signal S21 has the logic value of 0, the AND gate circuit 246B does not output the signal S11 to be the output clock signal CK-1, and outputs the output clock signal CK-1 having the logic value of 0.

Figure 3:
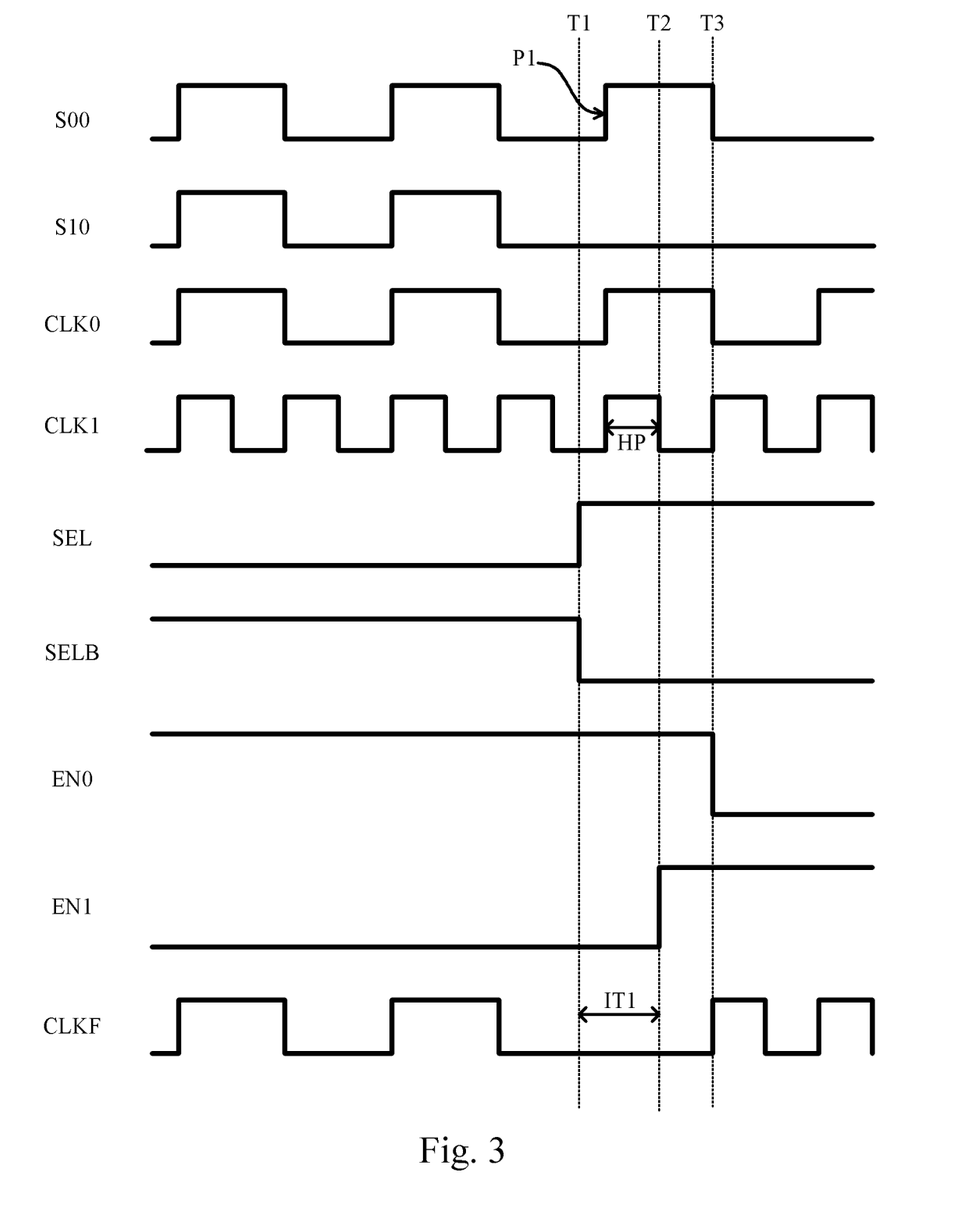
FIG. 3 is a schematic diagram illustrating waveforms of certain signals in FIG. 2 according to some embodiments of the present disclosure.

Reference is made to both FIG. 2 and FIG. 3, and FIG. 3 is a schematic diagram illustrating waveforms of certain signals in FIG. 2 according to some embodiments of the present disclosure. In FIG. 3, time T1 is at a negative half cycle of the clock signal CLK0. In response to the selection signal SEL, the clock multiplexer device 100 is switched to output the clock signal CLK1 to be the final clock signal CLKF at time T1. Prior to time T1, the clock multiplexer device 100 outputs the clock signal CLK0 to be the final clock signal CLKF.

At time T1, the selection signal SEL is transited from the logic value of 0 (e.g., low level) to the logic value of 1 (e.g., high level), and the selection signal SELB is transited from the logic value of 1 to the logic value of 0. In response to this selection signal SELB, the NAND gate circuit 246A outputs the signal S21 having the logic value of 1, and thus the AND gate circuit 246B outputs the signal S11 to be the output clock signal CK-1. In response to this selection signal SEL, the gating circuit 244 outputs the signal S01 to be the signal S11. At time T1, the enable signal EN1 has the logic value of 0. In response to this enable signal EN1, the AND gate circuit 242B outputs the signal S01 having the logic value of 0 (i.e., the clock signal CLK1 is not outputted to be the signal S01). Under this condition, the output clock signal CK-1 (not shown) has the low level.

At time T1, the enable signal EN1 has the logic value of 0 and the enable signal EN0 has the logic value of 1. In response to this enable signal EN1, the NAND gate circuit 226A outputs the signal S20 having the logic value of 1, and thus the AND gate circuit 226B outputs the signal S10 to be the output clock signal CK-0. In response to this enable signal EN0, the AND gate circuit 222B continues to output the clock signal CLK0 to be the signal S00. In response to this selection signal SELB, the gating circuit 224 masks a positive edge P1 of the signal S00 to generate the signal S10, and thus the signal S10 is kept having the logic value of 0. Under this condition, during an interval IT1 from time T1 to time T2, the output circuitry 260 generates the final clock signal CLKF having the low level.

At time T2, the synchronizer circuit 242A outputs the enable signal EN1 having the logic value of 1. In response to this enable signal EN1, the AND gate circuit 242B outputs the clock signal CLK1 to be the signal 501. Under this condition, the signal S01 is outputted, by the gating circuit 244 and the gating circuit 246, to be the output clock signal CK-1, and the output circuitry 260 outputs the output clock signal CK-1 to be the final clock signal CLKF. In other words, at time T2, the clock multiplexer device 100 outputs the clock signal CLK1 to be the final clock signal CLKF. In this embodiment, the clock multiplexer device 100 is switched from outputting the clock signal CLK0 to outputting the clock signal CLK1 according to the control of the control circuitry 240 that processes the clock signal CLK1. Moreover, at time T2, in response to the enable signal EN1 and the selection signal SEL, the NAND gate circuit 226A outputs the signal S20 having the logic value of 0. Under this condition, the output clock signal CK-0 is kept having the logic value of 0. Accordingly, the clock signal CLK0 is gated and does not affect the final clock signal CLKF.

At time T3, the synchronizer circuit 222A outputs the enable signal EN0 having the logic value of 0. In response to this enable signal EN0, the AND gate circuit 222B outputs the signal S00 having the logic value of 0. In other words, the AND gate circuit 222B does not output the clock signal CLK0 to be the signal S00. Meanwhile, the gating circuit 224 masks the signal S00. As a result, a signal path of outputting the clock signal CLK0 to the final clock signal CLKF can be completely turned off.

As shown in FIG. 3, the selection signal SEL (and/or the selection signal SELB) is transited at time T1, in order to indicate that the output circuitry 260 is switched to output the clock signal CLK1, and a level of the final clock signal CLKF during an interval IT1 that begins from time T1 is determined by the clock signal CLK1. The interval IT1 is set to be longer than or equal to a half period HP of the clock signal CLK1. During the interval IT1, the gating circuit 224 and the gating circuit 226 are able to prevent the clock signal CLK0 from being outputted to be the final clock signal CLKF. As a result, it is able to avoid generating glitches in the course of switching from outputting the clock signal CLK0 to outputting the clock signal CLK1. After the interval IT1, the clock multiplexer device 100 is able to be switched to output the clock signal CLK1 to be the final clock signal CLKF stably. Accordingly, as mentioned above, the duration of the interval IT1 is determined by the enable signal EN1, and the enable signal EN1 is determined based on the clock signal CLK1. In other words, the clock multiplexer device 100 switches the final clock signal CLKF based on a control of a clock signal that is going to be outputted (which is, in the above example, the clock signal CLK1).

Figure 4:
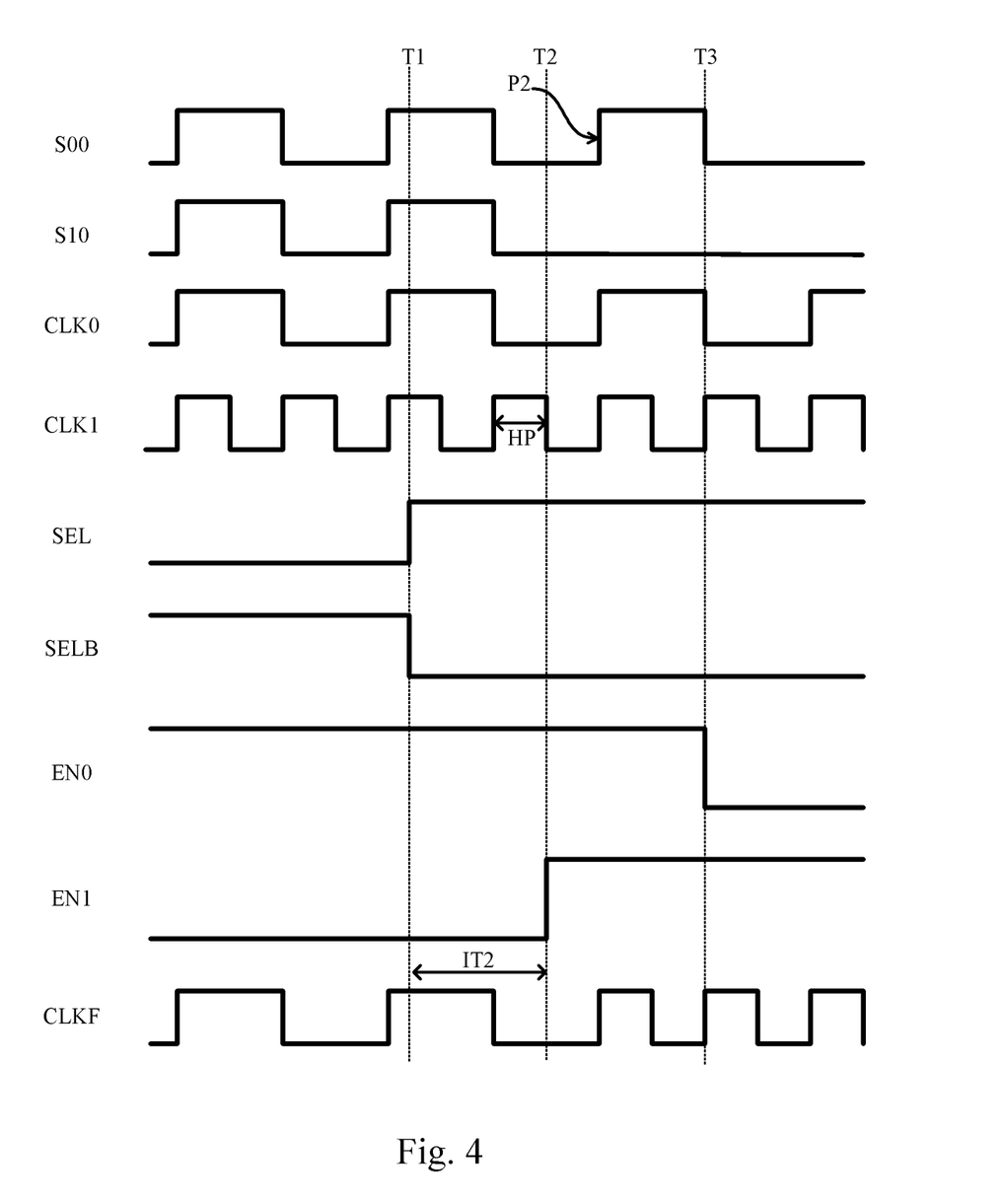
FIG. 4 is a schematic diagram illustrating waveforms of certain signals in FIG. 2 according to some embodiments of the present disclosure.

Reference is made to both of FIG. 2 and FIG. 4, and FIG. 4 is a schematic diagram illustrating waveforms of certain signals in FIG. 2 according to some embodiments of the present disclosure. Compared with FIG. 3, in this example, time T1 is at a positive half cycle of the clock signal CLK0. At time T1, the selection signal SEL is transited from the logic value of 0 to the logic value of 1, and the selection signal SELB is transited from the logic value of 1 to the logic value of 0. At time T1 shown in FIG. 4, as the enable signal EN1 has the logic value of 0 (which is the same as that in FIG. 3) and thus operations the control circuitry 240 at time T1 are the same as of those at time T1 in FIG. 3. In other words, at time T1, the gating circuit 244 outputs the signal S01 to be the signal S11, and the gating circuit 246 outputs the signal S11 to be the output clock signal CK-1.

Moreover, compared with FIG. 3, the behavior of the control circuitry 220 at time T1 is different. As the enable signal EN0 has the logic value of 1 at time T1, the gating circuit 222 outputs the clock signal CLK0 to be the signal S00. As the clock signal CLK0 has the logic value of 1 at time T1, the signal S00 also has the logic value of 1 at time T1. As mentioned above, the gating circuit 224 masks the positive edge of the signal S00 in response to the selection signal SELB having the logic value of 0, in order to generate the signal S10. As the signal S00 has the logic value of 1 at time T1, the gating circuit 222 outputs the signal S10 having the logic value of 1. Meanwhile, the enable signal EN1 has the logic value of 0, and thus the NAND gate circuit 226A outputs the signal S20 having the logic value of 1, and the AND gate circuit 226B outputs the signal S10 to be the output clock signal CK-0 in response to this signal S20. In other words, the gating circuit 226 still outputs the clock signal CLK0 to be the final clock signal CLKF at time T1.

At time T2, the synchronizer circuit 242A outputs the enable signal EN1 having the logic value of 1. In response to the enable signal EN1, the AND gate circuit 242B outputs the clock signal CLK1 to be the signal S01. Meanwhile, the NAND gate circuit 226A outputs the signal S20 having the logic value of 0, and the AND gate circuit 226B keeps outputting the output clock signal CK-0 having the logic value of 0 accordingly, such that the clock signal CLK0 does not affect the final clock signal CLKF. Moreover, at time T2, the signal S01 is outputted, by the gating circuit 244 and the gating circuit 246, to be the output clock signal CK-1, and the output circuitry 260 is able to output the output clock signal CK-1 to be the final clock signal CLKF. In other words, at time T2, the clock multiplexer device 100 outputs the clock signal CLK1 to be the final clock signal CLKF. Similar to FIG. 3, in this example, the clock multiplexer device 100 is switched to output the clock signal CLK1 according to the control of the control circuitry 240 that processes the clock signal CLK1. In an interval between time T2 and time T3, in response to the selection signal SELB having the logic value of 0, the gating circuit 224 masks a positive edge P2 of the signal S00 to generate the signal S10, and thus the signal S10 is kept having the logic value of 0.

At time T3, the synchronizer circuit 222A outputs the enable signal EN0 having the logic value of 0. In response to this enable signal EN0, the AND gate circuit 222B outputs the signal S00 having the logic value of 0. In other words, the AND gate circuit 222B does not output the clock signal CLK0 to be the signal S00. As a result, a signal path of outputting the clock signal CLK0 to the final clock signal CLKF can be completely turned off.

As shown in FIG. 4, the selection signal SEL (and/or the selection signal SELB) is transited at time T1, in order to indicate that the output circuitry 260 is switched to output the clock signal CLK1, and a level of the final clock signal CLKF during an interval IT2 that begins from time T1 is determined by the clock signal CLK1. The interval IT2 is set to be equal to or longer than the half period HP of the clock signal CLK1. As a result, it is able to avoid generating glitches in the course of switching from outputting the clock signal CLK0 to outputting the clock signal CLK1. After the interval IT2, the clock multiplexer device 100 is able to be switched to output the clock signal CLK1 to be the final clock signal CLKF. Similar to the interval IT1 in FIG. 3, the duration of the interval IT2 is determined by the enable signal EN1, and the enable signal EN1 is determined based on the clock signal CLK1. In other words, the clock multiplexer device 100 switches the final clock signal CLKF based on the control of the clock signal that is going to be outputted (which is, in this example, the clock signal CLK1).

From FIG. 3 and FIG. 4, in some embodiments, when the clock multiplexer device 100 is switched from outputting the clock signal CLK0 to outputting the clock signal CLK1, the clock multiplexer device 100 outputs the clock signal CLK1 to be the final clock signal CLKF according to the control of the control circuitry 240 for processing the clock signal CLK1. In the above operations, the clock multiplexer device 100 is able to be switched to output the clock signal CLK1 without utilizing the clock signal CLK0 which is outputted in a previous operation. As a result, it is able to avoid occurring a deadlock state and is able to be not limited by the clock signal CLK0 having a slower rate.

Figure 5:
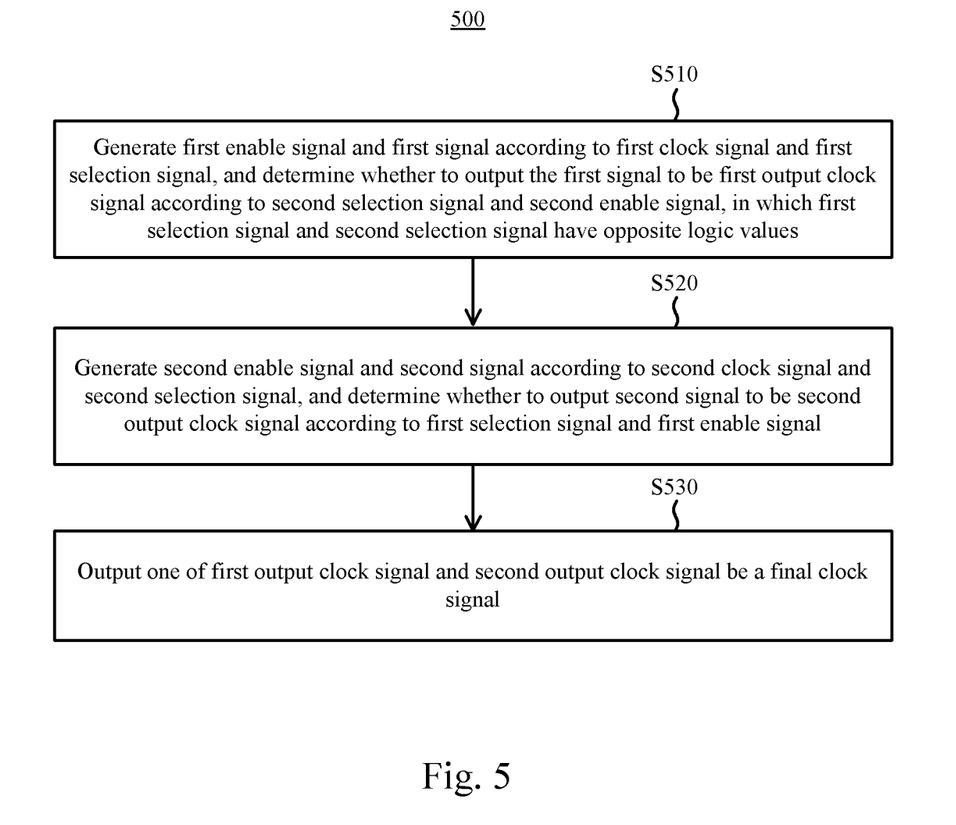
FIG. 5 is a flowchart of a clock switching method according to some embodiments of the present disclosure.

FIG. 5 is a flowchart of a clock switching method 500 according to some embodiments of the present disclosure. In operation S510, a first enable signal and a first signal are generated according to a first clock signal and a first selection signal, and whether to output the first signal to be a first output clock signal according to a second selection signal and a second enable signal, in which the first selection signal and the second selection signal have opposite logic values.

In operation S520, the second enable signal and a second signal are generated according to a second clock signal and the second selection signal, and whether to output the second signal to be a second output clock signal is determined according to the first selection signal and the first enable signal.

In operations S530, one of the first output clock signal and the second output clock signal is outputted to be a final clock signal.

The above operations can be understood with reference to various embodiments discussed above, and thus the repetitious descriptions are not given. The above description of the clock switching method 500 includes exemplary operations, but the operations are not necessarily performed in the order described above. Operations of the clock switching method 500 may be added, replaced, changed order, and/or eliminated as appropriate, or the operations are able to be executed simultaneously or partially simultaneously as appropriate, in accordance with the spirit and scope of various embodiments of the present disclosure.

As described above, the clock multiplexer device and the clock switching method provided in some embodiments of the present disclosure are not limited by a clock signal having slower rate, and are able to prevent switching operations from occurring the deadlock.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock multiplexer device, comprising:
a first control circuitry configured to receive a first selection signal according to a first clock signal to generate a first enable signal and a first signal according to the first clock signal and the first selection signal, and receive a second selection signal and a second enable signal to determine whether to output the first signal to be a first output clock signal according to the second selection signal and the second enable signal, wherein the first selection signal and the second selection signal have opposite logic values;
a second control circuitry configured to receive the second selection signal according to a second clock signal to generate the second enable signal and a second signal according to the second clock signal and the second selection signal, and receive the first selection signal and the first enable signal to determine whether to output the second signal to be a second output clock signal according to the first selection signal and the first enable signal; and
an output circuitry configured to output one of the first output clock signal and the second output clock signal to be a final clock signal,
wherein the first control circuitry comprises:
a first gating circuit configured to generate the first enable signal according to the first clock signal and the first selection signal, and to output the first clock signal to be a third signal according to the first enable signal;
a second gating circuit configured to determine whether to mask the third signal according to the first enable signal, in order to generate the first signal; and
a third gating circuit configured to determine whether to output the first signal to be the first output clock signal according to the second selection signal and the second enable signal.

2. The clock multiplexer device of claim 1, wherein the first gating circuit comprises:
a synchronizer circuit configured to receive the first selection signal according to the first clock signal and to generate the first enable signal; and
an AND gate circuit configured to generate the third signal according to the first enable signal and the first clock signal.

3. The clock multiplexer device of claim 2, wherein the synchronizer circuit comprises a plurality of flip flop circuits that are coupled in series, a first flip flop circuit in the plurality of flip flop circuits is configured to be triggered according to a positive edge of the first clock signal to receive the first selection signal, and a last flip flop circuit in the plurality of flip flop circuits is configured to be triggered according to a negative edge of the first clock signal to generate the first enable signal.

4. The clock multiplexer device of claim 1, wherein the second gating circuit is an integrated clock gating circuit, and is configured to mask a positive edge of the third signal according to the first selection signal to generate the first signal.

5. The clock multiplexer device of claim 1, wherein the third gating circuit comprises:
a NAND gate circuit configured to generate a fourth signal according to the second selection signal and the second enable signal; and
an AND gate circuit configured to generate the first output clock signal according to the fourth signal and the first signal.

6. The clock multiplexer device of claim 1, wherein if the first selection signal is transited at a first time to indicate that the output circuitry is switched from outputting the first output clock signal to outputting the second output clock signal, a level of the final clock signal during an interval that begins from the first time is determined by the second clock signal, and the interval is longer than or equal to a half period of the second clock signal.

7. The clock multiplexer device of claim 1, wherein the output circuitry comprises:
an OR gate circuit configured to generate the final clock signal according to the first output clock signal and the second output clock signal.

8. The clock multiplexer device of claim 1, wherein the first control circuitry and the second control circuitry have the same circuit architectures.

9. A clock switching method, comprising:
receiving, by a first control circuitry, a first selection signal according to a first clock signal to generate a first enable signal and a first signal according to the first clock signal and the first selection signal, and receiving, by the first control circuitry, a second selection signal and a second enable signal to determine whether to output the first signal to be a first output clock signal according to the second selection signal and the second enable signal, wherein the first selection signal and the second selection signal have opposite logic values;
receiving, by a second control circuitry, the second selection signal according to a second clock signal to generate the second enable signal and a second signal according to the second clock signal and the second selection signal, and receiving, by the second control circuitry, the first selection signal and the first enable signal to determine whether to output the second signal to be a second output clock signal according to the first selection signal and the first enable signal; and
outputting one of the first output clock signal and the second output clock signal to be a final clock signal,
wherein the first control circuitry comprises a first gating circuit, a second gating circuit, and a third gating circuit, and receiving, by the first control circuitry, the first selection signal according to the first clock signal to generate the first enable signal and the first signal according to the first clock signal and the first selection signal, and receiving, by the first control circuitry, the second selection signal and the second enable signal to determine whether to output the first signal to be the first output clock signal according to the second selection signal and the second enable signal comprises:
generating, by the first gating circuit, the first enable signal according to the first clock signal and the first selection signal, and outputting, by the first gating circuit, the first clock signal to be a third signal according to the first enable signal;
determining, by the second gating circuit, whether to mask the third signal according to the first enable signal, in order to generate the first signal; and determining, by the third gating circuit, whether to output the first signal to be the first output clock signal according to the second selection signal and the second enable signal.

10. The clock switching method of claim 9, wherein if the first selection signal is transited at a first time to indicate to switch from outputting the first output clock signal to outputting the second output clock signal, a level of the final clock signal during an interval that begins from the first time is determined by the second clock signal, and the interval is longer than or equal to a half period of the second clock signal.

11. The clock switching method of claim 10, wherein generating the first enable signal according to the first clock signal and the first selection signal, and outputting the first clock signal to be the third signal according to the first enable signal comprises:
   receiving, by a synchronizer circuit of the first control circuitry, the first selection signal according to the first clock signal and generating, by the synchronizer circuit, the first enable signal; and
   generating, by an AND gate circuit of the first control circuitry, the third signal according to the first enable signal and the first clock signal.

12. The clock switching method of claim 10, wherein determining whether to mask the third signal according to the first enable signal, in order to generate the first signal comprises:
   masking, by an integrated clock gating circuit of the first control circuitry, a positive edge of the third signal according to the first selection signal to generate the first signal.

13. The clock switching method of claim 10, wherein determining whether to output the first signal to be the first output clock signal according to the second selection signal and the second enable signal comprises:
   generating, by a NAND gate circuit of the third gating circuit, a fourth signal according to the second selection signal and the second enable signal; and
   generating, by an AND gate circuit of the third gating circuit, the first output clock signal according to the fourth signal and the first signal.

14. The clock switching method of claim 9, wherein outputting the one of the first output clock signal and the second output clock signal to be the final clock signal comprises:
   generating, by an OR gate circuit, the final clock signal according to the first output clock signal and the second output clock signal.

15. The clock multiplexer device of claim 1, wherein the first control circuitry directly receives the first clock signal.

16. The clock multiplexer device of claim 1, wherein the first control circuitry directly receives the second enable signal from the second control circuitry.

* * * * *